(12) United States Patent
Martin

(10) Patent No.: US 7,339,797 B2
(45) Date of Patent: Mar. 4, 2008

(54) CHIP MOUNT, METHODS OF MAKING SAME AND METHODS FOR MOUNTING CHIPS THEREON

(76) Inventor: Robert A. Martin, P.O. Box 161833, Austin, TX (US) 78716-1833

(*) Notice: Subject to any disclaimer, the term of this patent is extended or adjusted under 35 U.S.C. 154(b) by 484 days.

(21) Appl. No.: 10/140,358

(22) Filed: May 6, 2002

(65) Prior Publication Data

US 2002/0163071 A1 Nov. 7, 2002

Related U.S. Application Data

(63) Continuation of application No. 09/617,075, filed on Jul. 17, 2000, now abandoned, which is a continuation of application No. 08/964,531, filed on Nov. 5, 1997, now abandoned.

(51) Int. Cl.
*H01R 9/00* (2006.01)

(52) U.S. Cl. ............... 361/772; 361/775; 361/776; 361/813

(58) Field of Classification Search ........ 361/770–774, 361/813; 257/665–666
See application file for complete search history.

(56) References Cited

U.S. PATENT DOCUMENTS

| | | | |
|---|---|---|---|
| 4,258,381 A | 3/1981 | Inaba | 357/70 |
| 4,588,945 A | 5/1986 | Groves et al. | 324/158 R |
| 4,640,723 A | 2/1987 | Sugai et al. | 148/411 |
| 4,732,702 A | 3/1988 | Yamazaki et al. | 252/512 |
| 4,796,156 A | 1/1989 | Webster | 361/386 |
| 4,874,722 A | 10/1989 | Bednarz et al. | 437/209 |
| 4,903,401 A * | 2/1990 | Webb | 29/827 |
| 4,908,736 A | 3/1990 | Webster | 361/408 |
| 4,954,878 A | 9/1990 | Fox et al. | 357/81 |
| 4,977,442 A | 12/1990 | Suzuki et al. | 357/70 |
| 5,010,038 A | 4/1991 | Fox et al. | 437/215 |
| 5,075,760 A | 12/1991 | Nakashima et al. | 357/70 |
| 5,094,982 A | 3/1992 | Suzuki et al. | 437/209 |
| 5,095,404 A | 3/1992 | Chao | 361/385 |
| 5,096,852 A * | 3/1992 | Hobson | 29/827 |
| 5,106,784 A | 4/1992 | Bednarz | 437/214 |
| 5,164,815 A | 11/1992 | Lim | 257/666 |
| 5,227,661 A | 7/1993 | Heinen | 257/669 |
| 5,304,512 A | 4/1994 | Arai et al. | 437/211 |
| 5,309,017 A | 5/1994 | Maruyama | 257/666 |
| 5,313,102 A | 5/1994 | Lim et al. | 257/787 |
| 5,395,800 A | 3/1995 | Maruyama | 437/211 |
| 5,434,106 A | 7/1995 | Lim et al. | 437/209 |
| 5,436,492 A | 7/1995 | Yamanaka | 257/433 |
| 5,473,199 A * | 12/1995 | Murakami | 257/787 |
| 5,496,967 A | 3/1996 | Hashimoto et al. | 174/52.4 |
| 5,559,365 A | 9/1996 | Kobayashi | 257/666 |

(Continued)

*Primary Examiner*—Tuan T. Dinh
(74) *Attorney, Agent, or Firm*—Robert W Strozier

(57) ABSTRACT

The present invention describes a pre-fabricated chip mount and a method for making the pre-fabricated mount. The mount includes a mount body and a protective ring attached to the body by a plurality of tabs. The mount also includes a plurality of inner leads in electrical communication with the wires of at least one leadframe and a receiving area for an integrated circuit chip. The present invention also describes chips mounted on the pre-fabricated mount and methods for mounting, wire-bonding and encapsulating the chip in the mount. The mounts of the present invention can also be adapted to accommodate multiple chips and multi-level bonding schemes to the chips.

14 Claims, 5 Drawing Sheets

U.S. PATENT DOCUMENTS

| | | | |
|---|---|---|---|
| 5,623,123 A | 4/1997 | Umehara | 174/52.2 |
| 5,905,301 A | 5/1999 | Ichikawa et al. | 257/676 |
| 6,107,690 A * | 8/2000 | Courtenay et al. | 257/787 |

* cited by examiner

CHIP MOUNT, METHODS OF MAKING SAME AND METHODS FOR MOUNTING CHIPS THEREON

RELATED APPLICATIONS

This application is a continuation of U.S. patent application Ser. No. 09/617075, filed 17 Jul. 2000, now abandoned, which is a continuation of U.S. patent application Ser. No. 08/964,531, filed 5 Nov. 1997, now abandoned.

BACKGROUND OF THE INVENTION

1. Field of the Invention

This invention relates to a chip mount, a method for making the chip mount and a method for mounting the chip on the chip mount.

More particularly, the present invention relates to a chip mount having a designated chip flag area and configured so that at least one chip can be directly bonded to at least one flag area, wire bonded to the leads of at least one leadframe contained in the mount and encapsulated on the mount where the mount is substantially pre-fabricated so that the chip is exposed to only a limited number of post-mounting manufacturing steps.

2. Description of the Related Art

Integrated circuit dies or chips are subject to damage if not protected by some type of casing or packaging. Current integrated circuit chip packaging involves mounting the chip or integrated circuit device on a leadframe substraight material with an adhesive agent and assembling a chip mount around the attached chip.

Plastic packaging is one such method to protect fragile IC chips. A typical IC packaging process includes mounting an IC die on a leadframe flag area using a suitable adhesive. The IC die and the leadframe are wire bonded. The IC die and the wire bonded leadframe are encapsulated with plastic leaving the leads of the lead frame exposed. The molded frame then undergoes cleaning, which removes excess plastic from the outer leads, package body, and outer leadframe. The molded frame is then cured and the exposed leads are plated. Next, the dambars are cut and the outer leads are cut away from the outer portion of the frame and then formed into the desired shape.

Such plastic packaging processes subject the chip to damage at every step of the mounting manufacturing process which requires the scrapping of valuable IC die. Thus there is a need in the are for pre-fabricated mounts and methods of utilizing pre-fabricated mounts to reduce the number of steps that integrated circuit chip must endure during the mounting process.

SUMMARY OF THE INVENTION

This invention provides a chip mount including: a mount body; at least one flag area designed to receive a chip and located in the top or bottom surface of the mount body; and a plurality of leads electrically insulated one form the other and each lead having an exposed inner portion (inner lead) for electrical coupling to contacts on a chip associated with each flag area and an exposed outer portion (outer lead) designed for electrical coupling to external devices and designed to remain exposed after chip mounting. The chip mount can also include a protection device for protecting the outer leads during chip mounting such as a protective ring connected to the body by a plurality of bridges defining a plurality of hollow areas into which the outer leads can extend.

This invention also provides a chip mounted including a chip attached (generally adhesively attached) to each flag area of a mount as described above, a plurality of wire bonds connecting a plurality of contacts on the chip to the inner leads of the mount, and a cap encapsulating the bonded chip, the wire bonds and the inner leads to form a mounted chip where the outer leads remain exposed for electrical coupling to external devices.

The present invention also provides a method for making the mount comprising the step of pre-fabricating a mount comprising a mount body; at least one flag area designed to receive a chip; and a plurality of leads extending from each flag area and each lead having an exposed inner lead portion and exposed outer lead portion. Again, the mount can include a protection device such as a ring connected to the mount body by a plurality of bridges defining a plurality of hollow areas designed to protect the outer leads and to allow the outer leads to be cut and formed.

The method can include the step of forming a mount body out of a curable electrically insulating (non-conductive) material such as plastic, epoxy resin or other molding compositions commonly used in chip manufacturing. During molding, a plurality of leads are placed into the mount and positioned therein so that inner leads are exposed and so that the leads are electrically insulated one from the other. At least one flag area, designed to receive a chip, is formed so that the inner leads are exposed and located at or near an edge of each flag area.

This invention also provides a method for mounting a chip including affixing or bonding (generally adhesively bonding) a chip onto each flag area of a mount of the present invention; forming a plurality of electrical connections between a plurality of contacts on the chip and a plurality of the inner leads associated with each flag area of the mount; and encapsulating, encasing or embedding the chip, the connections and the inner leads in plastic or other non-conductive material, commonly used to make mounted chips to protect the chip, the inner leads and the connections. The method can also include removing a protective device such as a ring and attachment bridges to produce a mounted chip ready for installation. The method can optionally include cleaning and/or deflashing steps to clean the mount of excess mold compound or encapsulation compound and to shape and size the mount.

BRIEF DESCRIPTION OF THE DRAWINGS

The invention can be better understood with reference to the following detailed description together with the appended drawings in which like elements are numbered the same.

DESCRIPTION OF THE PREFERRED EMBODIMENTS

Figure 1A:
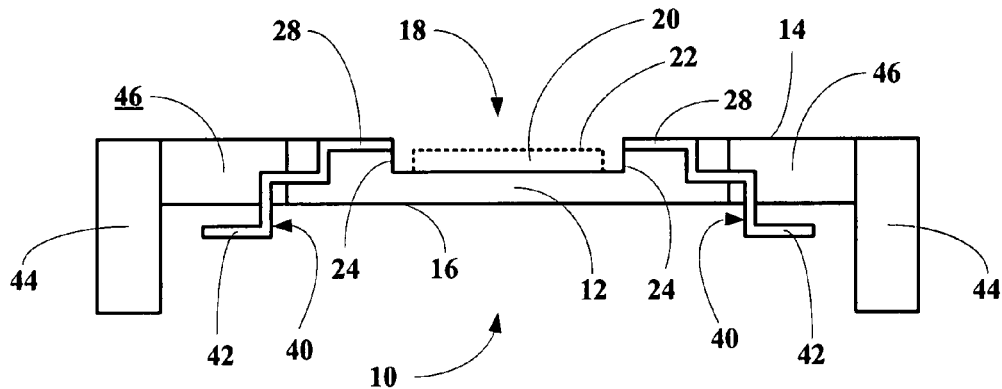
FIG. 1A is a cross sectional view of a completed chip mount.

The invention has found that an improved procedure for mounting chips can be implemented which will reduce the discard rate of mounting integrated circuit devices by reducing the number of processing steps the integrated circuit chip is subjected to during mounting.

This invention relates to a chip mount including: a mount body; at least one flag area designed to receive a chip and located on a top or bottom surface of the mount body; and a plurality of leads extending outward from each flag area. The leads include an inner portion sometimes referred to as the inner leads located at or near each flag area designed for electrical coupling to contacts on the chip or IC device and an outer portion sometimes referred to as the outer leads for electrically coupling to external devices such as printed circuits. The plurality of leads can be a leadframe or a plurality of leadframes.

Additionally, the mount can include a protective device to protect the outer leads and the chip once mounted and to provide the portion the mount that is handled by the processing equipment. The protective device associated with or connected to the mount body, which may be a ring, generally includes or defines a plurality of hollow areas into which the outer leads may extend to be accessible for subsequent processing. The protective device is generally removed after chip mounting.

This invention also provides a mounted chip including a chip adhesively attached to each flag area of the mount described above, a plurality of wire bonds connecting a plurality of contacts on the chip to the inner leads, and a cap encapsulating the adhesively bonded chip, the inner leads and the wire bonds so that the outer lead remain exposed for forming electrical contacts with external devices.

This invention also provides a method for making the mount comprising the steps of: forming a pre-mount including: a mount body; at least one flag area designed to receive a chip and located in a top or bottom surface of the mount body; and a plurality of leads embedded or encased in the mount so that inner leads are exposed at or near an edge of each flag area and a plurality of outer leads are exposed at or near an edge of the mount body. Generally, the plurality of leads is part of a leadframe, but other lead systems can also be used. The mount can also include a mount protection ring designed to protect the mount body and outer leads during post-formation processing connected to the body by a plurality of bridges and defining a plurality of hollow areas into which the outer leads can extend to be trimmed, formed, and made accessible to external devices.

This invention also provides a method for mounting a chip comprising the steps of: bonding a chip to each flag area of a pre-fabricated mount of the present; forming a plurality electrical connections between a plurality of contacts on the chip and a plurality of the inner leads; and encapsulating or encasing the chip, the inner leads and the connections in a plastic or other non-conductive material to protect the chip and the connections. Additionally, the method can include removing the protective device and cleaning or deflashing the mounted chip.

Generally, the chip mount of the present invention is composed of a leadframe or frames that have been encapsulated in a type of mold compound. There is also a flag area formed into the mold compound where the IC die, chip or device will be attached to the pre-formed mount. If the flag area includes electronic circuitry, then a metallic base can be adhered to or integrated with the flag area or adhered to or integrated with the IC die before die bonding.

The mold compound can also be molded to form a protective device such as a protective ring around the chip mount adapted to hold the chip mount in place and to protect the outer leads and mount body from being damaged during subsequent processing. The protective ring can also define hollow areas into which the outer leads can extend making them accessible in order to remove the dambars and to form the leads into a desired shape. Because typical leadframes are constructed as a strip with more than one leadsystem per strip, the protective rings of the present invention can also be connected together in a string so that the leadframe strips can be continuously set down into the protective rings during molding.

Generally, the procedure for making the chip mount of the present invention involves encapsulating only the leadframe in a plastic material. The encapsulated leadframe can then be deflashed or cleaned of excess mold material to expose and clean the inner leads and the outer leads of the mount. The cleaned mount is then cured. Optionally, the inner leads and the outer leads can be plated; the dambar can be cut from between the outer leads; and forming the outer leads of the chip mount into a desired shape. It is understood that plating can be done at any of the preceding steps or at the very end of the process, and that cleaning could occur several times after any of the preceding steps.

The encapsulated or molded plurality of lead such as a leadframe forms a partially completed chip mount. The areas that are molded are the chip receiving areas (flag areas) so that the inner leads are at or near an edge of each flag area. Preferably, a protective ring is formed from the encapsulating material which extends outwards from the chip. Dambars leave the outer leads void of molding compound. The die sections of the mold press clamp and seal against the leadframe and the dambars to create cavities or hollow areas with no mold.

The partially completed chip mount and protective ring can now proceed through deflash where unneeded or excess plastic or mold compound is cleaned from the chip mount and protective ring. Deflashing can also make the chip mount an exact height which allows control over the mount bodies dimensions, the protective right dimensions and the inner leads bonding heights.

After the chip mount mold compound has cured, the outer lead can be cut and formed. It is understood that the curing could have occurred before or after deflash. Now only the framing portion of the leadframe remain molded within a protective ring attached to the chip mount with bridges that form hollow spaces in to which the outer leads can protrude. The outer leads can then be formed into a desired shape because the mold compound has encapsulated the inner leads holding the leads in place, while leaving the inner leads exposed so that the inner leads can be brought into electrical contact with contacts on the chip.

If required, the inner leads and/or the outer leads can be plated. If plating is required, the leadframe will preferably remain intact before the leads are trimmed and formed.

The chip mount must be cleaned. The cleaning can be done after mold cure and before plating. It is important that the chip mount be completely void of all contaminants before the IC die is exposed to the chip mount. After cleaning, an IC chip is mounted onto each flag area of the chip mount with any suitable adhesive agent.

Generally, the procedure for attaching an IC die to the chip mount includes mounting the IC die or chip onto the flag area of the pre-molded chip mount; wire bonding contacts on the IC die to the inner leads of the mount body; encapsulating the IC die, the inner leads and wire bonded leads in a plastic or other non-conductive material; and trimming the finished molded device from the protective ring to form a finished mounted IC die or chip product such as a mountable memory chip or processor chip.

Electrical connections between the contacts or contact areas on the IC chip and the inner leads of the chip mount are preferably accomplished by bonding wires from the IC chip bonding pads, contacts or contact areas to the proper inner leads. There are several well known wire bonding methods that can be implemented. Important considerations include the following: the amount of heat the mold compound can absorb before reaching its glassing point; how much heat the IC chip can withstand before damage occurs; and the nature of the material being used for the wire bonding and/or the inner leads such gold, tin, aluminum, etc. Although wire bonding is preferred any other bonding technique can be used provided that the bonding pad and contacts on the IC chip are place in electrical communication with the desired inner leads.

The IC die and wire bonded inner leads are then encapsulated with plastic which embeds the flag areas, the IC chip, the wire bonds, the inner leads and a portion of the mount past the inner leads. There are generally two methods to encapsulate the exposed IC chip and wires. The first method involves encapsulating the IC chip on the chip mount with plastic, glass, epoxy, or some other nonconductive material that would protect the IC chip from contamination. The encapsulated chip mount is then preferably capped with a cover plate. The second method involves encapsulating the IC chip in molding compound in a mold press. The encapsulated frame and IC die are then cleaned of any excess plastic or molding compound, the plastic or compound is then cured and the finished device is cut from the protective ring.

The pre-molded package with the protective ring has several advantages. The pre-molded package can be surfaced to a specific level, making the bonding heights of the inner leads more consistent, thus accommodating the equipment used to produce IC packaging. The outer dimensions and size of the protective ring are also important for machine handling as larger sizes provide more support than a fragile metal leadframe. The design layout is also more flexible because lead counts can be increased by simply using more than one leadframe in the mount body. This latter arrangement will eliminate the need for more complex leadframes. Moreover, the new process will only expose the IC die or chip to the plastic packaging process during the steps of: die bonding, wire bonding, mold encapsulating and deflashing. These four process step generally have very low scrap rates as opposed to current processing where the majority of scrapping of IC dies and chips occurs in plating, singulating, trimming and forming.

Figure 1B:
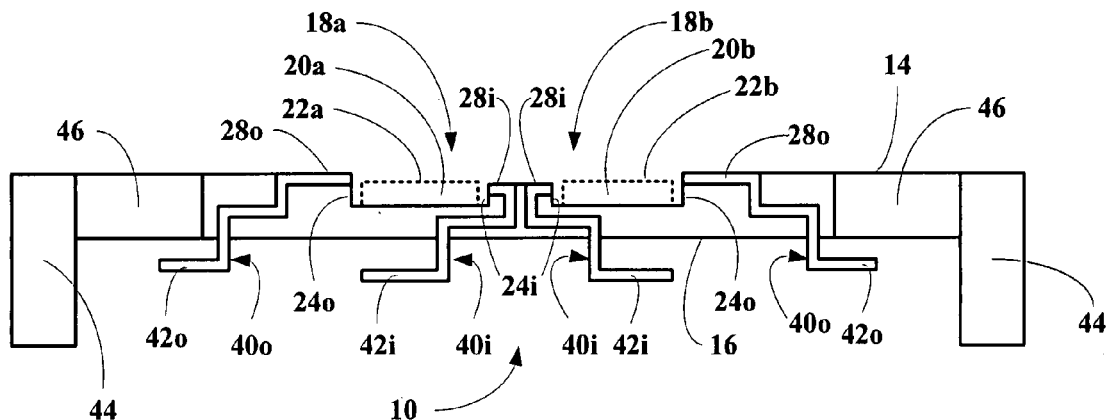
FIG. 1B is a cross sectional view of a completed chip mount having two flag areas on the same surface of the mount.
Figure 1C:
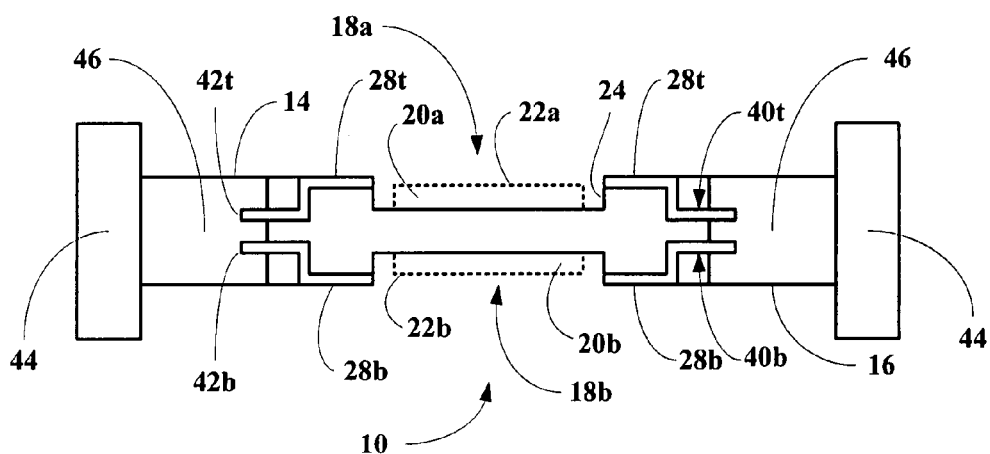
FIG. 1C is a cross sectional view of a completed chip mount having two flag areas on opposite surfaces of the mount.
Figure 2:
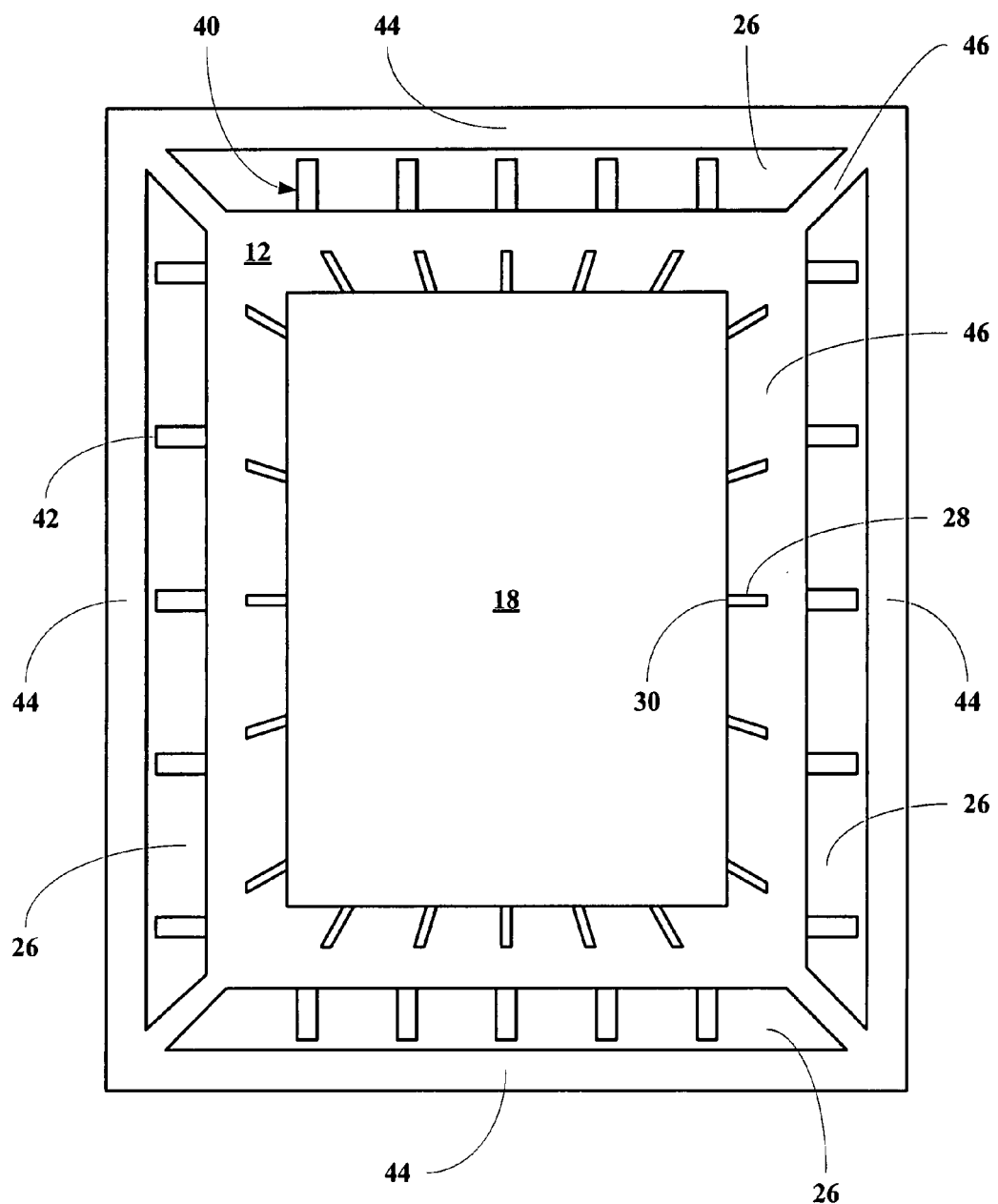
FIG. 2 is a top view of a completed chip mount.

Referring now to FIGS. 1 and 2, a mount 10 includes a mount body 12 having a top surface 14 and a bottom surface 16. The top surface 14 of the mount body 12 includes at least one area 18 designed to receive an integrated circuit chip 20 (shown in phantom in FIG. 1A). The area 18 is sometimes reference to herein as a flag area. The flag area 18 is preferably recessed into the top surface 14 of the mount body 12 so that a top 22 of the chip or die 20 is either below (as shown) or substantially co-planar with the top surface 14 of the mount body 12. However, it should be understood that the flag area 18 can be below, co-planar, or above the top surface 14 depending on the design of the final product.

Embedded in the top surface 14 of the mount body 12 and extending from an edge 24 of the recessed flag area 18 toward a plurality of hollow areas 26 is a plurality of leads 40. Each lead 40 includes a first end 28 sometimes referred to as lead finger or inner lead. The inner leads 28 are designed to be brought into electrically connected to or in electrical communication with contacts 34 (shown in FIG. 3) on the chip 20. Of course, each inner lead 28 can be either connected or unconnected to a chip contact depending on the chip design and/or the leadframe design. Each lead 40 also includes a second end 42 sometimes referred to as the outer leads extending into the plurality of hollow areas 26 and designed to be brought into electrical contact or communication with external devices such as printed circuit boards or other external devices well-known in the art.

The mount body 12 is generally protected by a protective ring 44 which is attached to the mount body 12 by a plurality of tabs 46. The tabs 46 are designed to be cut once the entire chip mounting process is complete. Removing the protective ring 44 and the tabs 46 exposes the outer leads 42 of the leads 40 so that the mounted chip can now be used in the manufacture of printed circuit or similar devices. Although protective rings are one method of protecting the out leads during chip mounting and encasing steps, other protecting devices can be used as well. Such other protection could include reusable holders which retain the mount, provide access to the flag areas for chip mounting, provide access to the inner lead and the chip contacts for wire bonding, provide access to the mounted chip and wire bonds for encasement and protect the outer leads from damage during chip mounting. Such devices would generally hold the mount at its four corners or the mount could include specially designed and optionally removable holding tabs or raised portions.

Referring now to FIG. 1B, a mount 10 includes a mount body 12 having a top surface 14 and a bottom surface 16. The top surface 14 of the mount body 12 includes two flag areas 18a&b designed to receive integrated circuit chips 20a&b (shown in phantom in FIG. 1B). The flag areas 18a&b are preferably recessed into the top surface 14 of the mount body 12 so that tops 22a&b of the chips or dies 20a&b are either below (as shown) or substantially co-planar with the top surface 14 of the mount body 12. However, it should be understood that the flag areas 18a&b can be below, co-planar, or above the top surface 14 depending on the design of the final product.

Embedded in the top surface 14 of the mount body 12 and extending from outer edges 24o of the recessed flag area 18a&b toward a plurality of hollow areas 26 is a plurality of outer leads 40o. Each outer lead 40o includes a first end 28o. The first ends 28o are designed to be brought into electrically connected to or in electrical communication with contacts 34 (similar to those shown in FIG. 3) on the chips 20a&b. Of course, each first end 28 can be either connected or unconnected to a chip contact depending on the chip design and/or the leadframe design. Each outer lead 40*o* also includes a second end 42*o* sometimes referred to as the outer leads extending into the plurality of hollow areas 26 and designed to be brought into electrical contact or communication with external devices such as printed circuit boards or other external devices well-known in the art. Also embedded in the top surface 14 of the mount body 12 and extending from inner edges 24*i* of the recessed flag areas 18*a*&*d* to below the bottom surface 16 of the body 12 ending in a plurality of inner leads 40*i* having first inner lead ends 28*i* and second inner lead ends 42*i*.

The mount body 12 is generally protected by a protective ring 44 which is attached to the mount body 12 by a plurality of tabs 46. The tabs 46 are designed to be cut once the entire chip mounting process is complete. Removing the protective ring 44 and the tabs 46 exposes the outer leads 42*i*&*o* of the leads 40*i*&*o* so that the mounted chip can now be used in the manufacture of printed circuit or similar devices. Although protective rings are one method of protecting the out leads during chip mounting and encasing steps, other protecting devices can be used as well. Such other protection could include reusable holders which retain the mount, provide access to the flag areas for chip mounting, provide access to the inner lead and the chip contacts for wire bonding, provide access to the mounted chip and wire bonds for encasement and protect the outer leads from damage during chip mounting. Such devices would generally hold the mount at its four corners or the mount could include specially designed and optionally removable holding tabs or raised portions.

Referring now to FIG. 1C, a mount 10 includes a mount body 12 having a top surface 14 and a bottom surface 16. The top surface 14 and the bottom surface 16 of the mount body 12 include flag areas 18*a*&*b* designed to receive integrated circuit chips 20*a*&*b* (shown in phantom in FIG. 1C). The areas 18*a*&*b* is sometimes reference to herein as a flag area. The flag areas 18*a*&*b* are preferably recessed into the top surface 14 and the bottom surface 16 of the mount body 12 so that tops 22*a*&*b* of the chips or dies 20*a*&*b* are either below (as shown) or substantially co-planar with the top surface 14 or bottom surface 16 of the mount body 12. However, it should be understood that the flag areas 18*a*&*b* can be below, co-planar, or above the top surface 14 and bottom surface 16 depending on the design of the final product.

Embedded in the top surface 14 and the bottom surface 16 of the mount body 12 and extending from an edge 24 of the recessed flag areas 18*a*&*b* toward a plurality of hollow areas 26 is a plurality of top leads 40*t* and a plurality of bottom leads 40*b*. Each lead 40*t* or 40*b* includes a first end 28*t* or 28*b*, respectively, sometimes referred to as lead finger or inner lead. The inner leads 28*t*&*b* are designed to be brought into electrically connected to or in electrical communication with contacts 34 (similar to those shown in FIG. 3) on the chips 20*a*&*b*. Of course, each inner lead 28*t*&*b* can be either connected or unconnected to a chip contact depending on the chip design and/or the leadframe design. Each lead 40*t*&*b* also includes a second end 42*t*&*b* sometimes referred to as the outer leads extending into the plurality of hollow areas 26 and designed to be brought into electrical contact or communication with external devices such as printed circuit boards or other external devices well-known in the art.

The mount body 12 is generally protected by a protective ring 44 which is attached to the mount body 12 by a plurality of tabs 46. The tabs 46 are designed to be cut once the entire chip mounting process is complete. Removing the protective ring 44 and the tabs 46 exposes the outer leads 42*t*&*b* of the leads 40*t*&*b* so that the mounted chip can now be used in the manufacture of printed circuit or similar devices. Although protective rings are one method of protecting the out leads during chip mounting and encasing steps, other protecting devices can be used as well. Such other protection could include reusable holders which retain the mount, provide access to the flag areas for chip mounting, provide access to the inner lead and the chip contacts for wire bonding, provide access to the mounted chip and wire bonds for encasement and protect the outer leads from damage during chip mounting. Such devices would generally hold the mount at its four corners or the mount could include specially designed and optionally removable holding tabs or raised portions.

Figure 3:
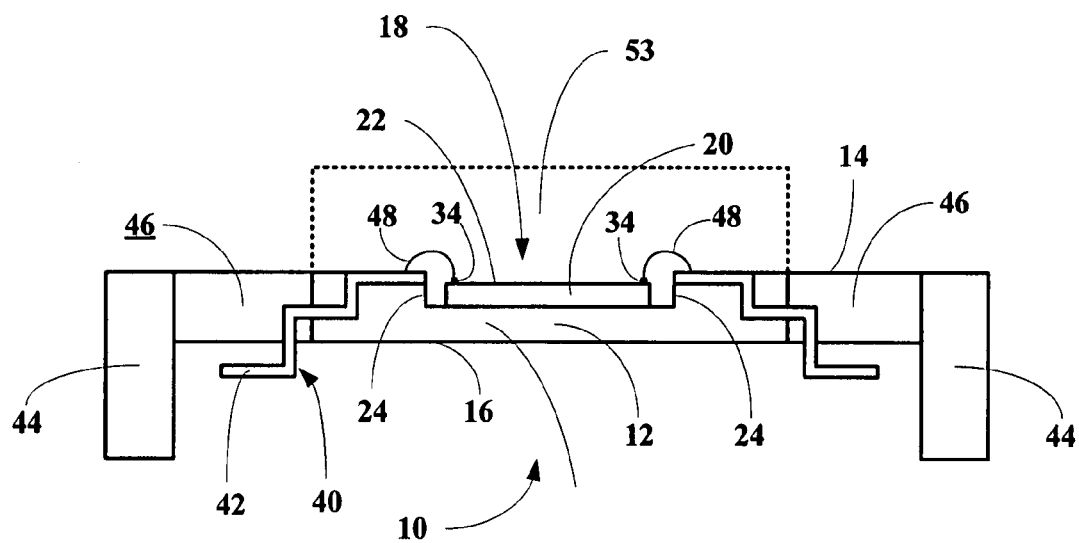
FIG. 3 cross sectional view of a complete chip mount showing mounted chip.
Figure 4:
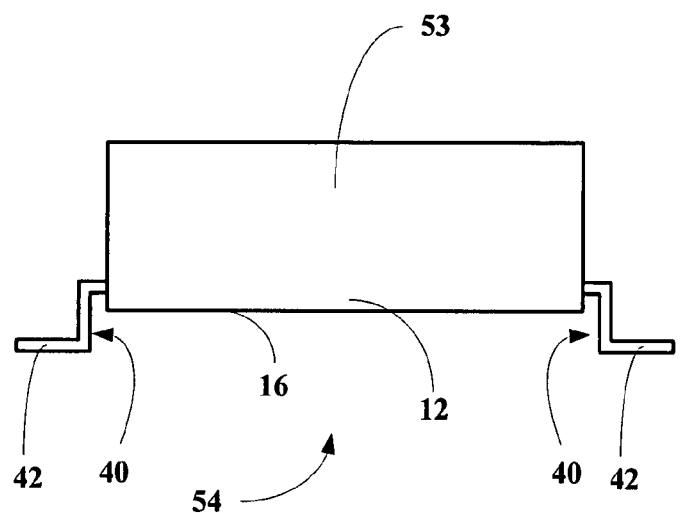
FIG. 4 is a fully completed chip mount package ready to be mounted.

Referring additionally now to FIGS. 3 and 4, once the mount 10 has been prefabricated, the integrated circuit chip 20 can be set into the flag area 18 and adhesively bonded in place as shown in FIG. 3. The adhesive is then generally cured so that the bond is secure. The adhesive is generally an epoxy resin; however, any other adhesive can be used as well, provided that the adhesive bonds the chip to the mount and does not adversely affect chip performance. With the chip 20 secured in place, chip contacts 34 are brought into electrical communication with the inner leads 28 of the leads 40 by wire bonds 48. The layout and number of wire bonds 48 will depend on the chip and/or leadframe design and the chips ultimate use. The mount 10 can support any number of wiring schemes including multi-level wiring schemes.

After wire bonding has been completed and checked, the chip 20, the wire bonds 48 the inner leads 28 are encapsulated in a plastic material to form a cap 53 which yields a final mounted chip. Only the outer leads 42 of leads 40 are not encapsulated in the plastic material and extend out from the mounted chip. These outer leads 42 provide the electrical communication pathways into and out of the chip 20.

Besides single level wire bonding as shown in FIGS. 1-4, the present invention also easily supports multi-level wire bonding for higher pin numbers. By multi-level wire bonding, the inventor means that the mount 10 can incorporated more than one leadframe or its equivalent. The inclusion of more than one leadframe or other similar lead format allows the final product to have many more electrical communication pathways into and out of the mounted chip. Such multi-level bonding scheme can also be used to package more than one integrated circuit chip into a single mount. Thus, a multi-level mount could support a central processing unit and a cache memory module or logic chips.

The bonding scheme between the chip contacts and the inner leads which will be exposed would include connections to the appropriate CPU contacts with the cache memory module and allow the cache and CPU to have independent electrical communication pathways to the outside world. Thus, the final product would support cache module communication with a main memory module or any chip combination, while the CPU would be connected with other hardware modules. Other multi-chip and multi-level mount designs can be used as well limited only by physical space and human ingenuity.

Figure 5A:
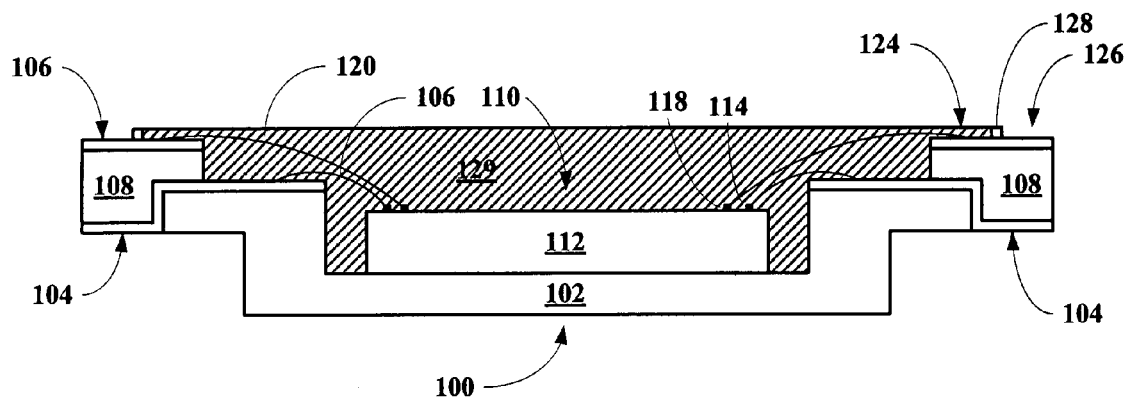
FIG. 5A cross sectional view of a multi leadframe chip mount.
Figure 5B:
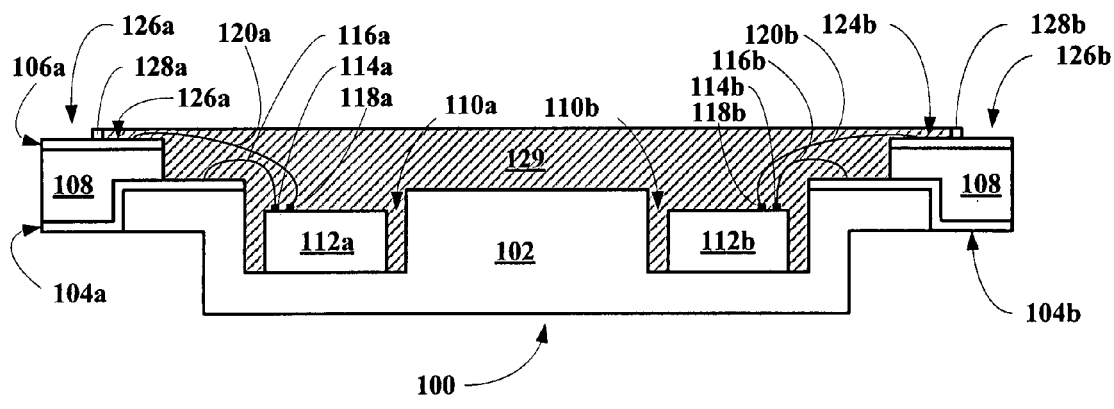
FIG. 5B cross sectional view of a multi leadframe chip mount having two flag areas on the same surface of the mount.
Figure 5C:
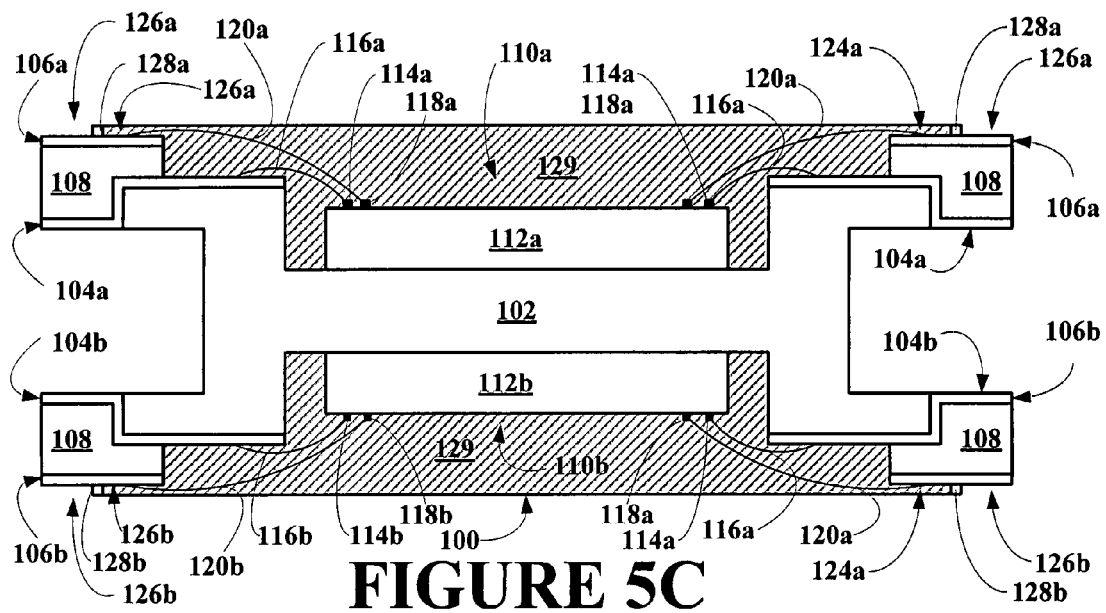
FIG. 5C cross sectional view of a multi leadframe chip mount having two flag areas on opposite surfaces of the mount.
Figure 6:
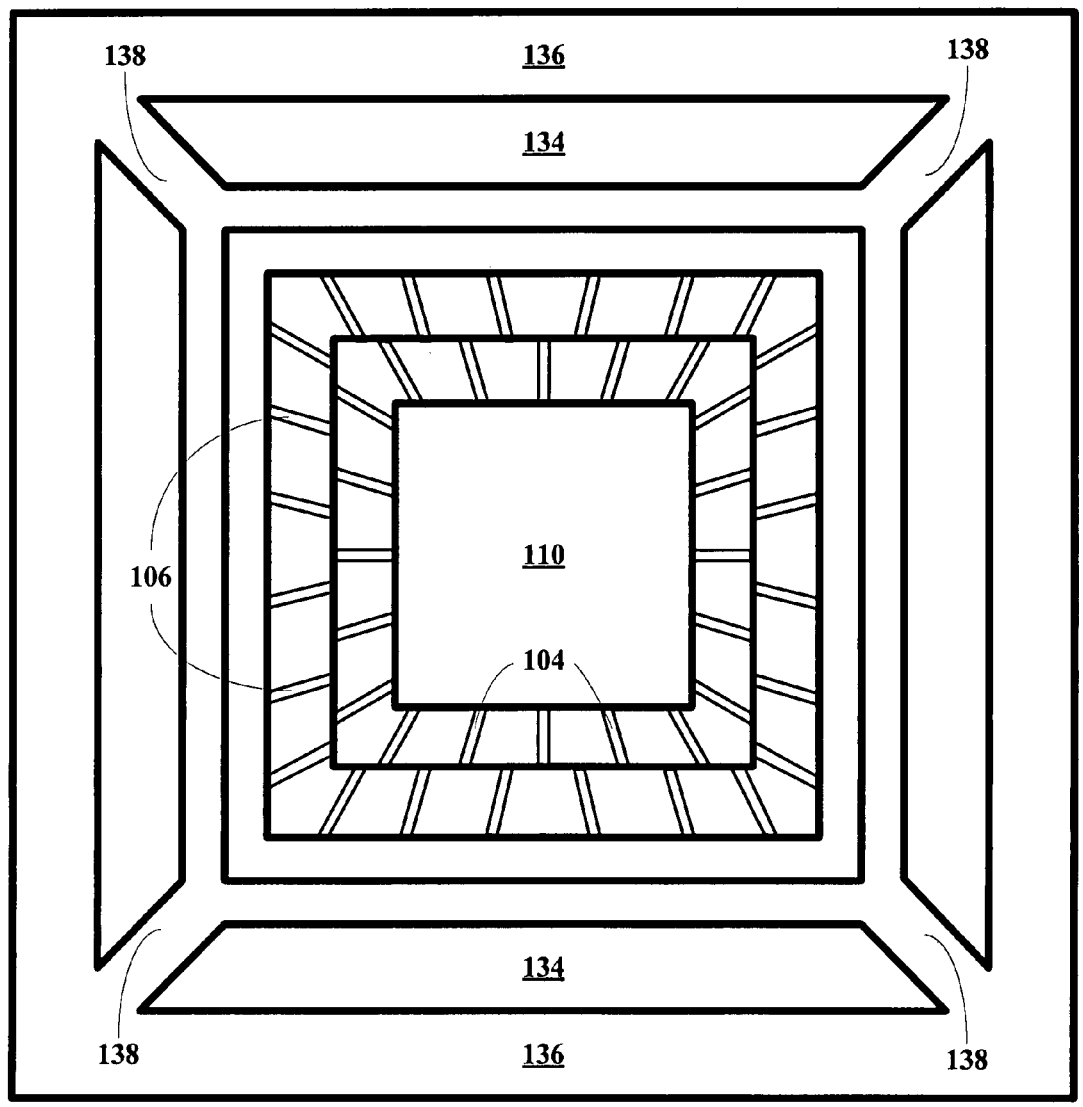
FIG. 6 cross sectional view of a multi leadframe chip mount showing protective ring.

Referring now to FIGS. 5A and 6, one such multi-level mount 100 is shown to include a mount body 102, a bottom plurality of leads 104, a top plurality of leads 106 having a bump 128 designed to allow the encapsulating material 129 to encapsulate an inner part 124 of the leads 106 and leave an outer part 126 of the leads 106 exposed, and an insulating layer 108 interposed therebetween. The mount 100 also includes at least one chip mount area 110, preferably recessed in the mount body 102. The mount 100 is shown with a chip 112 mounted adhesively in the area 110. One set of chip contacts 114 are bonded to the bottom plurality of leads 104 by wire bonds 116, while a second set of chip contacts 118 are bonded to the top plurality of leads 106 at the inner parts 124 by wire bonds 120 as shown in FIG. 5A. The mounting system shown in FIGS. 5-6 is sometimes referred to as a surface mounting system. Such mounting systems can then be combined with other wiring systems and manufacturing techniques to form multi-chip devices or to be combined with other wire bonding systems to form completed devices.

Referring now to FIG. 5B, one such multi-level mount 100 is shown to include a mount body 102, two plurality of bottom leads 104a&b, two plurality of top leads 106a&b, and insulating layers 108 interposed therebetween. The top leads 106a include bumps 128a&b designed to allow the encapsulating material 129 to encapsulate inner parts 124a&b of the top leads 106a&b and leave outer parts 126a&b of the top leads 106a&b exposed. The mount 100 also includes two chip mount areas 110a&b, preferably recessed in the mount body 102. The mount 100 is shown with two chips 112a&b mounted adhesively in the areas 110a&b. Chip contacts 114a&b are bonded to the bottom plurality of leads 104a&b by wire bonds 116a&b, while chip contacts 118a&b are bonded to the top plurality of leads 106a&b at the inner parts 124a&b by wire bonds 120a&b as shown in FIG. 5B. The mounting system shown in FIGS. 5-6 is sometimes referred to as a surface mounting system. Such mounting systems can then be combined with other wiring systems and manufacturing techniques to form multi-chip devices or to be combined with other wire bonding systems to form completed devices.

Referring now to FIG. 5C, one such multi-level mount 100 is shown to include a mount body 102, a bottom plurality of leads 104a&b, a top plurality of leads 106a&b having bumps 128a&b designed to allow the encapsulating material 129 to encapsulate inner parts 124a&b of the top leads 106a&b and leave outer parts 126a&b of the top leads 106a&b exposed, and an insulating layer 108 interposed therebetween. The mount 100 also includes two chip mount areas 110a&b, preferably recessed in the mount body 102 and one on a top side 103a of the mount 102 and one on a bottom side 103b of the mount 102. The mount 100 is shown with two chips 112a&b mounted adhesively in the areas 110a&b. Chip contacts 114a&b are bonded to the bottom plurality of leads 104a&b by wire bonds 116a&b, while chip contacts 118a&b are bonded to the top plurality of leads 106a&b at the inner parts 124a&b by wire bonds 120a&b as shown in FIG. 5C. The mounting system shown in FIGS. 5-6 is sometimes referred to as a surface mounting system. Such mounting systems can then be combined with other wiring systems and manufacturing techniques to form multi-chip devices or to be combined with other wire bonding systems to form completed devices.

Alternatively, the mount 100 the surface leads 104 and 106 can be replaced by other type of lead systems such as the leadframes of FIGS. 1-4. Again, the lead systems would include inner lead portions to be electrically coupled to contacts on the chip and outer lead portions to be electrically coupled to external devices. If the mount 100 includes leadframes instead of a surface mounting system, then the outer leads of the leadframes will extend into a plurality of hollow areas 134. Again, the hollow areas 134 are defined by the mount body 102 and a protective ring 136 and a plurality of connecting tabs 138 connecting the protective ring 136 to the mount body 102.

The mounts of the present invention are manufactured as a unit of materials generally used to make integrated circuit mounts such as curable plastic material as is well-known in the art as further described in U.S. Pat. Nos. 5,106,784, 4,607,276 and 4,303,934, incorporated herein by reference. The mount body is generally made with the leadframe and its leads, which are combined during molding. The leadframes and the inner leads are set in place and are molded together and thermally cured to set the chipmount. Excess plastic is cleaned from the mount containing the leadframe and the inner and outer leads.

The pre-fabricated mount incorporating at least one leadframe and a set of inner leads provides great flexibility to the chip designers. The pre-fabricated mounts can be made with more than one level of leadframes to accommodate the ever increasing density of contacts on the chip surface and the ever increasing number of contacts the chip needs to the outside.

Although the invention has been disclosed with reference to its preferred embodiments, from reading this description those of skill in the art may appreciate changes and modification that may be made which do not depart from the scope and spirit of the invention as described above and claimed hereafter.

I claim:

1. A pre-fabricated chip mount comprising:
   a. a mount body;
   b. a plurality of flag areas;
   c. a plurality of lead structures comprising bottom leads, top leads, and insulating layers interposed between corresponding top leads and bottoms leads, one structure for each flag area, where each top lead include an inner part, an outer part and a bump adapted to allow encapsulating material to encapsulate the inner part leaving the outer part exposed and where each bottom lead includes an inner part adapted to be encapsulated by the encapsulating material and an outer exposed part,
   where each flag area is designed to receive a chip and wire bonds bonding chip contacts to corresponding inner parts of the top leads and bottom leads of the lead structure associated with the flag area and where the pre-fabricated chip mount is designed to have each flag area, the chips, the wire bonds, the inner parts of the top and bottom leads and a portion of the mount body between the bumps on the top leads embedded in a nonconductive material.

2. The mount of claim 1, further comprising:
   d. a protection ring attached to the mount body by a plurality of bridges defining hollows areas into which the outer ends extend.

3. The mount of claim 1, wherein the leads comprise a leadframe.

4. The mount of claim 1, wherein the leads comprise a plurality of leadframes.

5. The mount of claim 1, wherein the flag areas are located in a top surface of the mount body.

6. The mount of claim 2, wherein the mount body, the bridges and the protective ring are made of a non-conductive material and the protective ring and bridges are removable.

7. The mount of claim 5, wherein each flag area includes a metallic base onto which each chip is mounted and wherein each flag area is located in an indentation in the mount body.

8. A mounted chip comprising:
   a. a pre-fabricated chip mount including:
      i. mount body;

ii. a plurality of flag areas;
iii. a plurality of lead structures comprising bottom leads, top leads, and insulating layers interposed between corresponding top leads and bottoms leads, one structure for each flag area, where each top lead include an inner part, an outer part and a bump adapted to allow encapsulating material to encapsulate, the inner part leaving the outer part exposed and where each bottom lead includes an inner part adapted to be encapsulated by the encapsulating material and an outer exposed part,
b. a chip mounted in each flag area;
c. a plurality of electrically conductive wire bonds connecting contacts on the chip to corresponding inner parts of the top leads and bottom leads of the lead structure associated with the flag area; and
d. a cover comprising a nonconductive material embedding the flag areas, the chips, the wire bonds, the inner parts of the top and bottom leads and a portion of the mount body between the bumps on the top leads in the nonconductive material.

9. The chip of claim 8, further comprising:
  e. a protective rings secured to the mount body by a plurality of bridges.

10. The chip of claim 8, wherein the leads comprise a leadframe.

11. The chip of claim 8, wherein the leads comprise a plurality of leadframes.

12. The chip of claim 8, wherein the flag areas are located in a top surface of the mount body.

13. The chip of claim 9, wherein the mount body, the protective ring and the bridges and made of a non-conductive material and the protective ring and the bridges are removable.

14. The chip of claim 12, wherein each flag area includes a metallic base onto which each chip is mounted and wherein each flag area is located in an indentation in the mount body.

* * * * *